United States Patent
Iisaka

(10) Patent No.: US 11,553,632 B2
(45) Date of Patent: Jan. 10, 2023

(54) PRODUCTION SYSTEM AND PRODUCTION SYSTEM CONTROL METHOD

(71) Applicant: FUJI CORPORATION, Chiryu (JP)

(72) Inventor: Jun Iisaka, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 461 days.

(21) Appl. No.: 16/627,903

(22) PCT Filed: Aug. 8, 2017

(86) PCT No.: PCT/JP2017/028744
§ 371 (c)(1),
(2) Date: Dec. 31, 2019

(87) PCT Pub. No.: WO2019/030818
PCT Pub. Date: Feb. 14, 2019

(65) Prior Publication Data
US 2020/0128710 A1   Apr. 23, 2020

(51) Int. Cl.
| H05K 13/08 | (2006.01) |
| H05K 13/04 | (2006.01) |
| G05B 15/02 | (2006.01) |
| H05K 13/02 | (2006.01) |

(52) U.S. Cl.
CPC ........... *H05K 13/084* (2018.08); *G05B 15/02* (2013.01); *H05K 13/0215* (2018.08); *H05K 13/0419* (2018.08); *H05K 13/083* (2018.08); *H05K 13/0882* (2018.08)

(58) Field of Classification Search
CPC .............. H05K 15/02; H05K 13/0215; H05K 13/0419; H05K 13/083; H05K 13/084
See application file for complete search history.

(56) References Cited

U.S. PATENT DOCUMENTS

2015/0083845 A1* 3/2015 Kawaguchi ........ H05K 13/0419
242/563
2019/0004501 A1 1/2019 Iisaka et al.

FOREIGN PATENT DOCUMENTS

| JP | 4629637 B | * | 2/2011 |
| JP | 2012-043886 | * | 3/2012 |
| JP | 5424686 B | * | 2/2014 |
| JP | 2015-060956 A | * | 3/2015 |
| WO | WO 2016/203632 A1 | | 12/2016 |

OTHER PUBLICATIONS

International Search Report dated Nov. 14, 2017 in PCT/JP2017/028744 filed Aug. 8, 2017.

* cited by examiner

*Primary Examiner* — Carl J Arbes
(74) *Attorney, Agent, or Firm* — Oblon, McClelland, Maier & Neustadt, L.L.P.

(57) ABSTRACT

It is an object of the present invention to provide a production system and a control method for the production system that can suppress erroneous mounting when a tape feeder is shared and used even when latest tape feeder information is not shared among multiple production lines in a production system having multiple production lines. Information that matches the tape feeder database stored by the line management device is stored in the tape feeder. When the tape feeder is mounted on the mounting machine, the information stored in the tape feeder is read, and when it is determined that the information does not match the tape feeder database, mounting of the electronic component supplied from the tape feeder is stopped.

6 Claims, 7 Drawing Sheets

PRODUCTION SYSTEM AND PRODUCTION SYSTEM CONTROL METHOD

TECHNICAL FIELD

The present application relates to a production system and a control method of the production system.

BACKGROUND ART

Patent Literature 1 discloses a production system including a line management device for controlling a work machine and a centralized management apparatus connected to the line management device, and the production system causes the work machine to continue work when a network failure occurs between the centralized management apparatus and the line management device. More specifically, the line management device acquires multiple pieces of control data in advance from the centralized management apparatus, and when a network failure with the centralized management apparatus is detected, the work of the work machine is continued based on the multiple pieces of control data acquired by the line management device.

When the work machine is a mounting work machine for mounting an electronic component supplied from a tape feeder to a board, the multiple pieces of control data may include collation information for preventing erroneous mounting. The collation information includes, for example, information on the arrangement of tape feeders in the slots of the mounting work machine and information on the type of electronic components that can be used by the mounting work machine. Further, for the purpose of collating information, it is possible to have a configuration in which the line management device stores tape feeder information in which tape feeder IDs assigned to the tape feeders are linked with IDs of electronic components held by the tape feeders. In this configuration, the collating is done in the following manner. First, when a tape feeder is attached, the mounting work machine acquires the tape feeder ID assigned in advance to the tape feeder and transfers it to the line management device. Next, in the line management device, the tape feeder information is referred to and collated with the electronic component ID linked with the transferred tape feeder ID, and it is determined whether the tape feeder and the electronic component held by the tape feeder are usable. When it is determined that the tape feeder and the electronic component are usable, the mounting work machine performs the mounting work. The tape feeder information is updated, for example, when an electronic component is attached to an empty tape feeder, when an electronic component is spliced to a held electronic component, or the like.

PATENT LITERATURE

Patent Literature 1: WO 2016/203632

BRIEF SUMMARY

Technical Problem

Incidentally, a tape feeder may be moved and used among multiple production lines. For example, when a tape feeder used in a first production line is moved to a second production line and an electronic component is added in the second production line, the tape feeder information stored in the line management device of the second production line is updated. However, when a network failure occurs, the line management device of the first production line cannot update its stored tape feeder information in accordance with the update of the tape feeder information stored in the line management device of the second production line. For this reason, when the tape feeder is returned to the first production line again, collation of collation information is performed on old tape feeder information stored in the line management device of the first production line, which may cause erroneous mounting.

In consideration of the above-described problem, it is an object of the present application to provide a production system and a control method of the production system which can suppress erroneous mounting when a tape feeder is shared and used, in a production system having multiple production lines, even when the latest tape feeder information is not shared among the multiple production lines.

Solution to Problem

The present specification discloses a production system, comprising: multiple production lines, each production line having at least one electronic component mounting machine; a line management device provided in each of the multiple production lines; a tape feeder having a mounting section configured to be mounted with a component tape in which electronic components are accommodated in a carrier tape; and a communication device configured to acquire a tape feeder ID assigned to a tape feeder and a component ID assigned to a component tape when the component tape is mounted in a tape feeder whose mounting section is not mounted with a component tape, and transmit tape feeder information to the line management device of the production line in which mounting is to be performed and said tape feeder, the tape feeder information including acquired tape feeder IDs and component IDs which are linked with each other; wherein each of the line management device and the tape feeder stores the tape feeder information when the tape feeder information from the communication device is transmitted; and the electronic component mounting machine executes a reading process in which the tape feeder information is read from the tape feeder when the tape feeder is mounted; a receiving process in which the tape feeder information read in the reading process, and an inquiry as to whether said tape feeder information and the tape feeder information stored in the line management device match, are transmitted to the line management device of the production line in which the tape feeder is mounted, and the result of said inquiry is received; and a stopping process which stops a mounting of the electronic component supplied by said tape feeder when a non-matching result is received.

Advantageous Effects

According to the present disclosure, even when the latest tape feeder information is not shared among multiple production lines in a production system having multiple production lines, it is possible to suppress erroneous mounting when tape feeders are shared and used.

DESCRIPTION OF EMBODIMENTS

Figure 1:
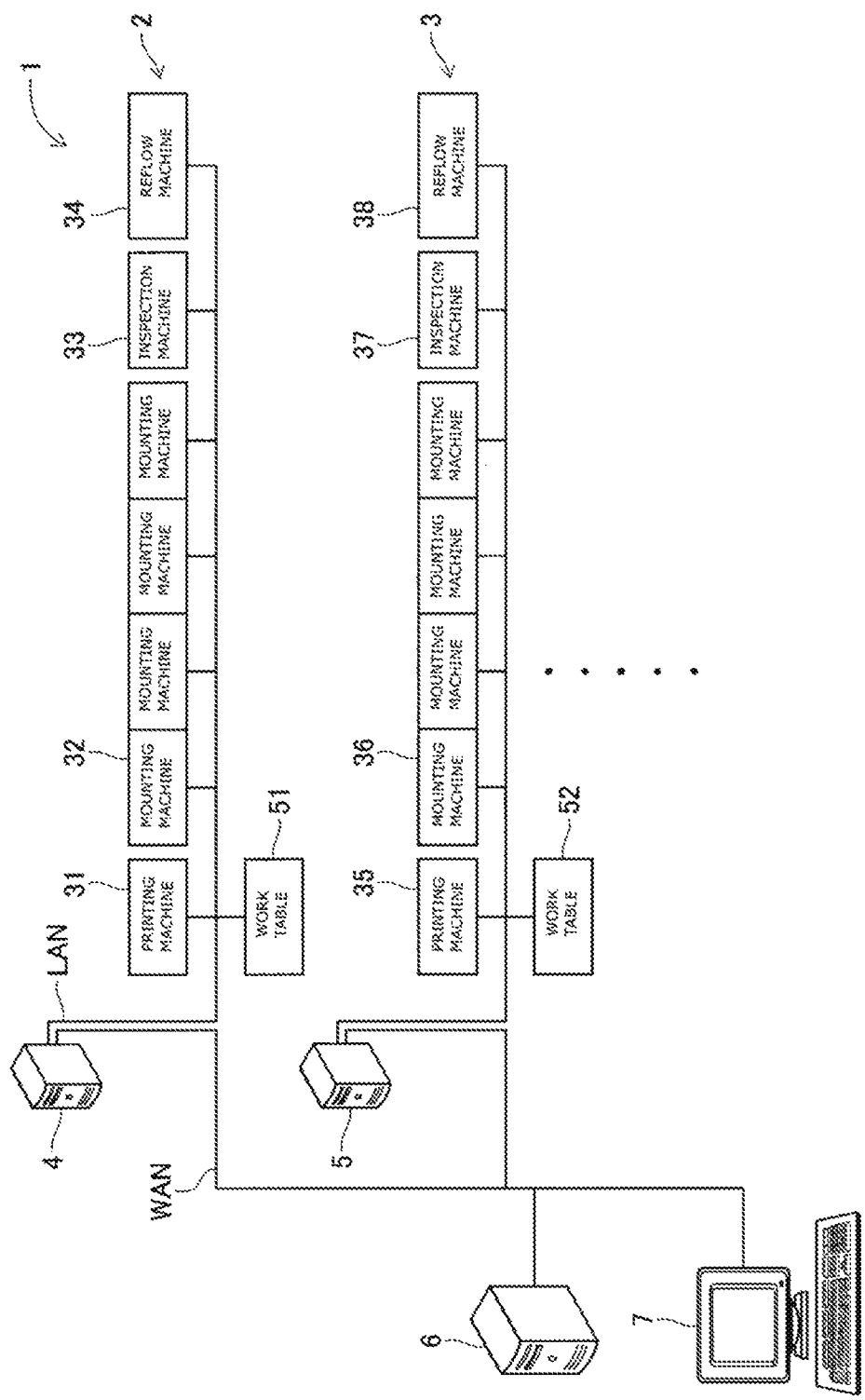
FIG. 1 A diagram showing a configuration of a board mounting production system according to an embodiment.

Embodiments of the present disclosure will be described below with reference to the drawings. FIG. 1 shows a configuration of board mounting production system (hereinafter, referred to as a "production system") 1, that is an embodiment of the production system of the present disclosure, in which electronic components are mounted on a board such as a printed circuit board (PCB). As shown in FIG. 1, production system 1 includes multiple production lines 2, 3, only two of which are shown in FIG. 1, centralized management apparatus 6, and central management terminal 7.

Production line 2 is constructed with screen printing machine 31, multiple electronic component mounting machines 32, inspection machine 33, reflow machine 34, and work table 51, and is managed by line management device 4. Similarly, production line 3 is constructed with screen printing machine 35, multiple mounting machines 36, inspection machine 37, reflow machine 38, and work table 52, and is managed by line management device 5. In the following description, production line 2 of production lines 2, 3 will be mainly described. Since production line 3 has the same configuration as production line 2, description thereof is omitted as appropriate.

Screen printing machine 31, for example, moves a squeegee along a mask with a squeegee moving device and prints a cream-like solder on a board conveyed in production line 2 through through-holes in the mask. The multiple mounting machines 32 are for mounting electronic components on a board, for example. Each of the multiple mounting machines 32 shares work according to, for example, the type of electronic component and performs component mounting work on a board conveyed by production line 2. Inspection machine 33, for example, inspects the mounting state, such as the mounting position, electrical characteristics, and the like of an electronic component mounted on a board. By performing heat treatment on the board, and melting and solidifying cream-like solder printed by screen printing machine 31, reflow machine 34 electrically bonds the board and the electronic component. The number, type, order of arrangement, and the like of the devices (i.e., screen printing machine 31 and mounting machine 32) included in production line 2 shown in FIG. 1 are examples and are not limited thereto.

Work table 51 is used for preparing tape feeder 70, which will be described later, and has a holding table (not shown) for holding tape feeder 70.

Line management device 4 is, for example, a server device for management developed by the manufacturer of the work machine, such as screen printing machine 31. The user can manage production line 2 constituted by screen printing machine 31 or the like by operating line management device 4. Line management device 4 manages various types of data used in production line 2 and various types of information to be transmitted to centralized management apparatus 6, the details of which will be described later. Line management device 4 is connected to wide area network WAN, to which centralized management apparatus 6 is connected, and local network LAN, to which screen printing machine 31 and the like are connected.

Line management device 4, screen printing machine 31, multiple mounting machines 32, inspection machine 33, and reflow machine 34 are connected to each other via local network LAN. Line management device 4, screen printing machine 31, and the like mutually transmit and receive data through local network LAN by communication conforming to a unique communication protocol defined by the manufacturer of, for example, mounting machine 32 and the like. The communication protocol unique to the manufacturer is, for example, a protocol capable of transmitting and receiving data using a TCP/IP protocol.

Centralized management apparatus 6 is, for example, a server that is installed in a data center of a manufacturing company that manufactures a mounting board with production system 1 and collectively manages data of production lines 2, 3 in each manufacturing factory in remote locations. Centralized management apparatus 6 is connected to line management devices 4, 5 of the respective factories via wide area network WAN. Centralized management apparatus 6 transmits and receives data to and from line management device 4 via an internet line by, for example, a secure communication protocol.

The network configuration shown in FIG. 1 is an example and can be changed as appropriate. For example, centralized management apparatus 6 and line management device 4 may be connected to each other via a local network. For example, centralized management apparatus 6 installed in a management building on the same site as line management device 4 installed in a manufacturing factory may be connected to each other via a local network.

Centralized management apparatus 6 stores, for example, production planning data, control data, material data, collation data, quality data, and the like. Production planning data includes, for example, a production start time, a scheduled finish time, control data to be used, and data in which production schedules of production lines 2, 3 to be operated are defined. The control data is data used for controlling each work machine, such as screen printing machine 31, mounting machine 32, inspection machine 33, and reflow machine 34, for manufacturing the mounting board. For example, the control data of mounting machine 32 is information related to the mounting positions of electronic components on the board, the type of electronic component to be mounted, the position of the feeders to be supplied, and the like. The control data of mounting machine 32 is linked with material data relating to the board and the electronic component. The material data includes, for example, information on the board and electronic components used in production in each of production lines 2, 3. The collation data is data used by each work machine to perform work as set. The collation data includes, for example, information such as the component type that can be used in the mounting machine. The quality data is, for example, data indicating the relationship of serial numbers such as which electronic components are mounted on which board.

Central management terminal 7 is connected to wide area network WAN, and is installed, for example, at the head office of a manufacturing company that manufactures a mounting board with production system 1. A user at the head office, for example, operates central management terminal 7 to create control data and production planning data, and transmits the control data and production planning data to centralized management apparatus 6 via wide area network WAN. Centralized management apparatus 6 transmits the control data in which material data is linked with each of line management devices 4, 5 of production lines 2, 3, respectively, for example, in accordance with production planning data. For example, every day, centralized management apparatus 6 transmits material data and control data required for one day of production in accordance with the start times of production lines 2, 3.

On the other hand, when line management devices 4, 5 receive quality data from mounting machine 32 or the like, for example, at the time of manufacturing the mounting board, line management devices 4, 5 transmit the quality data to centralized management apparatus 6 each time quality data is received. For example, a user at the head office can check the occurrence status of errors in production lines 2, 3 by operating central management terminal 7 to check quality data stored in centralized management apparatus 6.

Figure 2:
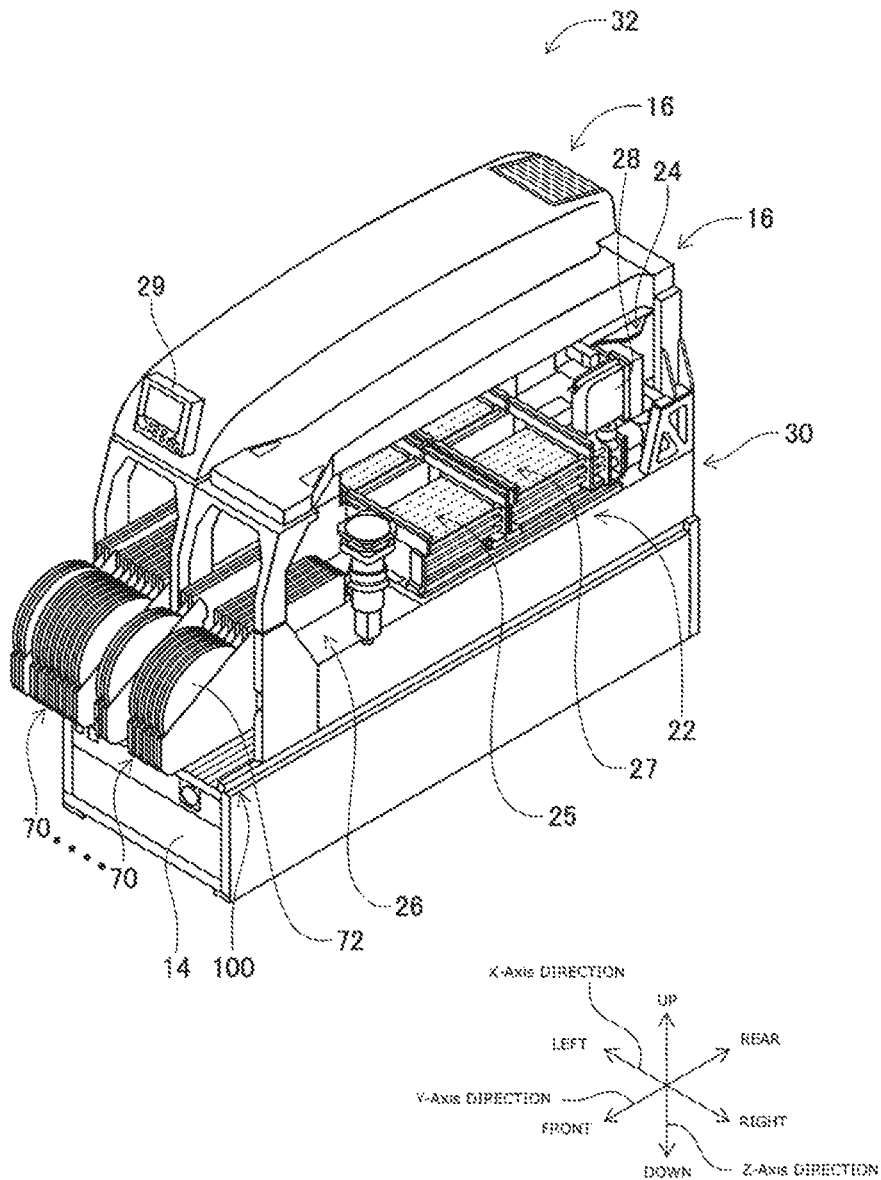
FIG. 2 A perspective view of an electronic component mounting device.

Next, mounting machine 32 will be described in detail with reference to FIG. 2. Mounting machine 32 includes system base 14 and two mounting machines 16. Two mounting machines 16 are installed adjacent to each other on system base 14. Mounting machine 16 includes frame section 30, conveyance device 22, mounting head moving device 24, supply device 26, and mounting head 28. Mounting machine 32 mounts the electronic component to the board conveyed by conveyance device 22. In the following description, the direction shown in FIG. 2 is used. The direction in which the board is conveyed by conveyance device 22 is the X-axis direction, and the horizontal direction orthogonal to the X-axis direction is the Y-axis direction. Operation device 29 is provided on the front of mounting machine 16. Operation device 29 has a display screen, operation switches, and the like. The user can check information such as the operational state of mounting machine 32 displayed on the display screen of operation device 29. In addition, the user can perform necessary operations and change settings on mounting machine 32 via the operation switches of operation device 29.

Conveyance device 22 includes two conveyor devices 25, 27. Conveyor devices 25, 27 extend in the X-axis direction and convey boards in the X-axis direction. Moving device 24 moves mounting head 28 in the X-direction and the Y-direction. Mounting head 28 picks up and releases the electronic component and mounts the electronic component to the board.

Supply device 26 is a feeder-type supply device, and is disposed at the front end of frame section 30. Feeder 26 includes tape feeder holding stand 100 for holding multiple tape feeders 70. As will be described later, tape feeder 70 opens component tape 80 (FIG. 3) wound around reel 72 (FIG. 3) while pulling out component tape 80 (FIG. 3), and feeds and supplies electronic components downstream from tape feeder 70.

Next, the operations of mounting work in mounting machine 16 will be described. The board is conveyed to a predetermined position by conveyor devices 25, 27. On the other hand, mounting head 28 moved to supply device 26 by moving device 24 holds electronic components fed out by supply device 26. Next, mounting head 28 moved to the mounting position of the board by moving device 24 releases the electronic component at the mounting position of the board. The above operation is repeated to mount the electronic component on the board.

Figure 3:
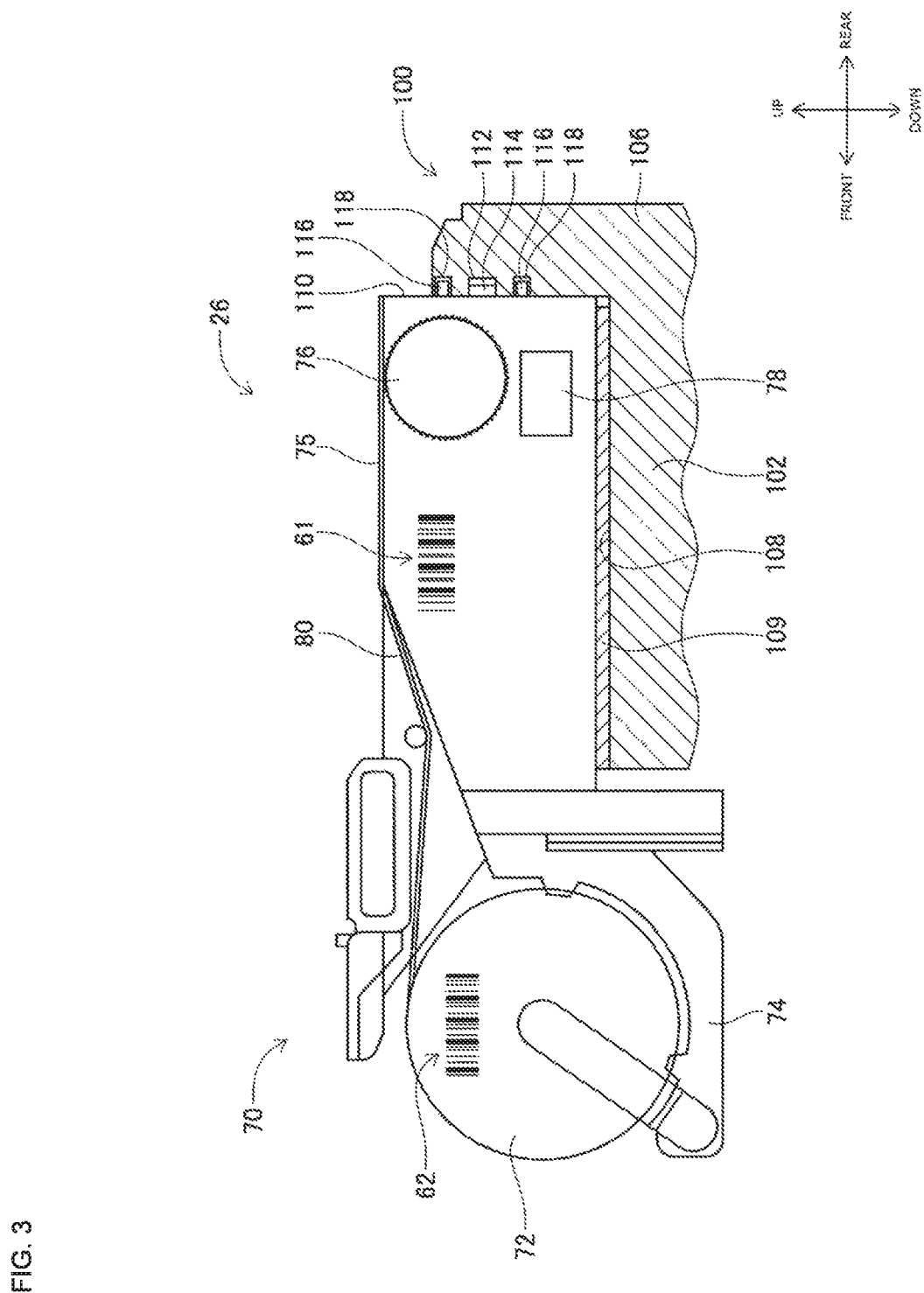
FIG. 3 A cross-sectional view of an electronic component supply device.

Next, supply device 26 and tape feeder 70 will be described in detail with reference to FIG. 3. Tape feeder holding stand 100 provided in supply device 26 has slide section 102, upright surface section 106, and the like. Slide section 102 has multiple slots 108 that mate with rails 109 disposed at the lower end of tape feeder 70. Connector connecting section 112 and fitting holes 118 are formed in upright surface section 106. Fitting holes 118, 118 are formed in the up-down direction with connector connecting section 112 interposed therebetween.

In addition to the above-described configuration, tape feeder 70 held by tape feeder holding stand 100 includes reel mounting section 74, feeder housing 75, sprocket 76, feed device 78, connector 114, standing pins 116, and the like.

Reel 72 is mounted on reel mounting section 74. Component tape 80 in which electronic components are taped is wound around reel 72. More specifically, in component tape 80, the electronic component is accommodated in the accommodating recess section of a carrier tape having an accommodating recess section and a feed hole, and a top cover tape is adhered thereto. Sprocket 76, feed device 78, and a separation device (not shown) are accommodated in feeder housing 75. Sprocket 76 is mechanically connected to delivery device 78 which rotates sprocket 76. Sprocket 76 pulls component tape 80 out of reel 72 by the teeth of sprocket 76 rotating in engagement with the feed holes of component tape 80. The peeling device also peels the top cover tape from the carrier tape. In this manner, tape feeder 70 delivers electronic components downstream.

Connector 114 and standing pins 116, 116 are provided on side wall surface 110 of feeder housing 75. Connector 114 is electrically connected to connector connecting section 112 of tape feeder holding stand 100. Standing pins 116, 116 are formed vertically with connector 114 interposed therebetween, and are each fitted into fitting holes 118, 118 of tape feeder holding stand 100. Tape feeder 70 is powered via connector 114. Tape feeder 70 transmits and receives signals via connector 114. In addition, supply device 26 is provided with a detector (not shown) for outputting a detected signal to CPU 131 (to be described later) in response to tape feeder 70 being mounted on tape feeder holding table 100. Bar codes 61, 62 are affixed to tape feeder 70 and reel 72, respectively. The details of bar codes 61, 62 will be described later.

The holding table (not shown) of work table 51 (FIG. 1) includes a slot (not shown) that fits with rail 109 of tape feeder 70 and a connector connection section (not shown) that is electrically connected to connector 114 of tape feeder 70, similarly to tape feeder holding table 100.

Figure 4:
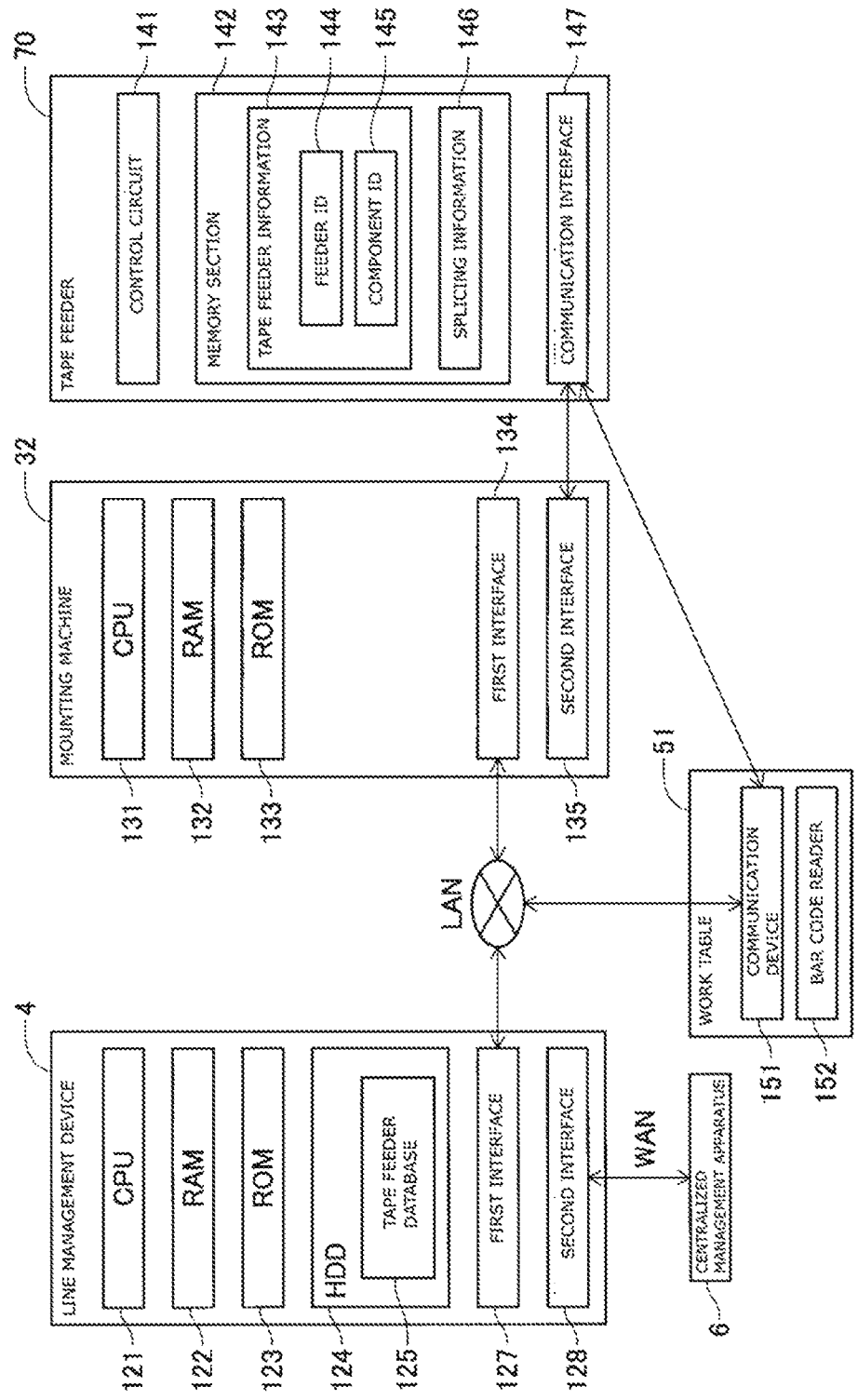
FIG. 4 A block diagram showing a control system of the board mounting production system.

Next, a control system of line management device 4, mounting machine 32, tape feeder 70, and work table 51 will be described with reference to FIG. 4. Since the multiple mounting machines 32 and tape feeders 70 provided in production line 2 have the same configuration, only one of each will be described.

Line management device 4 is a computer or the like and includes CPU 121, RAM 122, ROM 123, HDD (hard disk drive) 124, first interface 127, second interface 128, and the like, which are interconnected by buses (not shown). Firmware and the like are stored in ROM 123. RAM 122 is used as a main memory for CPU 121 to execute various processes. HDD 124 stores tape feeder database 125, various programs, various data, and the like. The various types of data are collation data, control data, and the like. First interface 127 is connected to local network LAN. Second interface 128 is connected to centralized management apparatus 6 via wide area network WAN.

Mounting machine 32 includes CPU 131, RAM 132, ROM 133, first interface 134, second interface 135, and the like, which are interconnected by buses (not shown). ROM 123 stores programs and the like for instructing the respective sections to operate. RAM 132 is used as a main memory for CPU 131 to execute various processes and stores control data and the like transmitted from line management device 4. CPU 131 controls various devices such as conveyance device 22 in accordance with control data or the like. First interface 134 is connected to local network LAN. Second interface 135 can communicate with communication interface 147 (described below) of tape feeder 70 via connector connection 112 (FIG. 3) of supply device 26 and connector 114 (FIG. 3) of tape feeder 70.

Tape feeder 70 includes control circuit 141, memory section 142, communication interface 147, and the like, which are electrically connected to each other. Control circuit 141 is, for example, a circuit board, and memory section 142 is, for example, nonvolatile memory such as flash memory. As will be described later, memory section 142 stores tape feeder information 143 and splicing information 146 in which component IDs 145 are linked with feeder IDs 144.

Work table 51 is provided with communication device 151 and bar code reader 152 which are connected to each other so as to be able to communicate with each other. Communication device 151 is connected to local network LAN, and transmits the information read by bar code reader 152 to line management device 4. Communication device 151 can communicate with communication interface 147 (described later) of tape feeder 70 via its own connector connection and connector 114 (FIG. 3) of tape feeder 70.

Production line 2 is provided with a bar code reader (not shown) configured to communicate with mounting machine 32.

Figure 5:
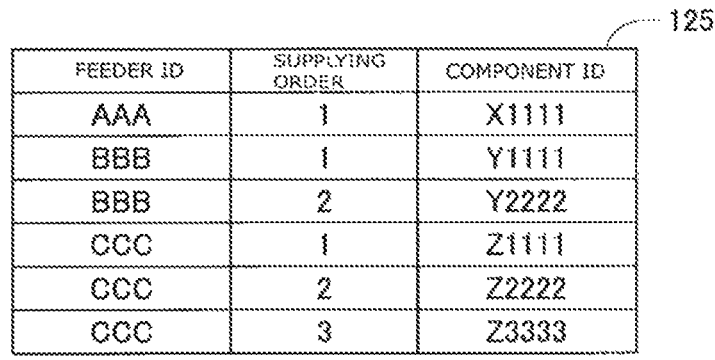
FIG. 5 A diagram describing tape feeder information.

In production system 1, various data such as production planning data, control data, material data, collation data, and quality data for a predetermined period such as one day are transmitted from centralized management apparatus 6 to line management devices 4, 5 in advance, and the various transmitted data are stored in line management devices 4, 5. Then, in a predetermined period, production lines 2, 3 produce in accordance with various data stored in line management devices 4, 5. As a result, even when a communication failure occurs in wide area network WAN, production lines 2, 3 can continue production. Line management device 4 updates tape feeder database 125 in response to the user mounting component tape 80 in tape feeder 70. As shown in FIG. 5, tape feeder database 125 is an information grouping of information in which feeder IDs uniquely assigned to each tape feeder 70 and a component ID uniquely assigned to the component tape held by tape feeder 70 are set for each tape feeder 70. It should be noted that even if the same manufacturer and the same component type are used, the same component ID is not assigned to the component tape 80, and a different component ID is assigned to each component tape 80. In tape feeder database 125, a number indicating a supply order to be supplied to mounting machine 32 by tape feeder 70 is linked with each component ID. Tape feeder database 125 is used for collation, for example, when tape feeder 70 is mounted in slot 108 of supply device 26, as will be described later. Tape feeder database 125 is used to create traceability information included in the quality data indicating which electronic components are mounted on which board.

In production system 1, tape feeder database 125 is created for each production line. On the other hand, tape feeder 70 is commonly used in multiple production lines. Therefore, a method of mounting electronic components in a mounting machine without erroneous mounting even when tape feeder 70 is moved and used among multiple production lines will be described next by taking mounting machine 32 as an example.

As described above, various data of a predetermined period are transmitted from centralized management apparatus 6 to each of line management devices 4, 5. Line management device 4 stores the transmitted various data in HDD 124. Similarly, line management device 5 stores the transmitted various data in its own HDD.

The user prepares reel 72, which goes to tape feeder 70, on work table 51, for example, in a preparation period before the start of manufacturing. The production planning data includes information on which electronic components are to be attached to which tape feeder 70. Therefore, the user performs the preparation work according to the production planning data. Here, it is assumed that tape feeder 70 and reel 72 are assigned a feeder ID and a component ID, respectively, in advance. In addition, it is assumed that bar code 61 (FIG. 3) indicating the assigned feeder ID is affixed to tape feeder 70. Similarly, it is assumed that bar code 62 (FIG. 3) indicating the assigned component ID is affixed to reel 72. The user causes bar code reader 152 to read bar codes 61, 62 during the preparation operation. Bar code reader 152 transmits the feeder ID and the component ID, which constitute information of the read bar codes 61, 62, to communication device 151. Communication device 151 transmits tape feeder information 143, in which the component ID is linked to the feeder ID acquired by transmission from bar code reader 152, to line management device 4 and tape feeder 70.

In the present embodiment, since communication devices such as communication device 151 are provided for each production line, such as production line 2, the user performs preparation work on work table 51 provided in production line 2 to which tape feeder 70 is to be mounted. Therefore, line management device 4 to which communication device 151 is connected via local network LAN, and to which communication device 151 transmits tape feeder information 143, is production line 2 to which tape feeder 70 is to be mounted. Line management device 4 updates tape feeder database 125 based on the transmitted tape feeder information 143. More specifically, line management device 4 adds the transmitted tape feeder information 143 to tape feeder database 125 and updates tape feeder information 143 as information having a "supplying order" of "1". When tape feeder information 143 is received, control circuit 141 of tape feeder 70 stores the received tape feeder information 143 in memory section 142 and sets splicing information 146 to an initial value of "0". Here, splicing information 146 is information capable of specifying the number of component tapes 80 mounted on the same production line to which splicing information 146 belongs.

Further, when the user splices and adds component tape 80 to tape feeder 70, bar codes 61, 62 are similarly read by bar code reader 152. Further, communication device 151 transmits to line management device 4 additional information in which the component ID is linked with the feeder ID acquired by being transmitted from bar code reader 152. Line management device 4 updates tape feeder database 125 based on the transmitted additional information. More specifically, line management device 4 adds the transmitted additional information to tape feeder database 125 and updates the value obtained by incrementing the value of the "supplying order" already stored for the corresponding feeder ID of tape feeder database 125. That is, the transmitted additional information is stored in tape feeder database 125 as information of "2" or later in the "supplying order".

Figure 6:
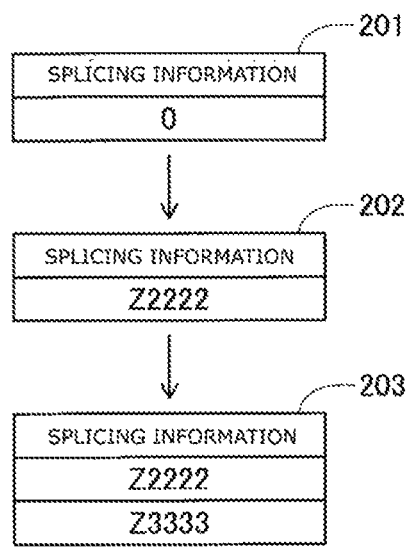
FIG. 6 A diagram describing splicing information.

Further, communication device 151 transmits the information of the added component ID to tape feeder 70. When tape feeder 70 receives the added component ID information, tape feeder 70 stores the transmitted component ID information in memory section 142 as splicing information 146. The details of splicing information 146 stored in memory section 142 of tape feeder 70 will be described with reference to FIG. 6.

For example, it is assumed that component tape 80 having the component ID of "Z1111" is mounted on tape feeder 70 having the feeder ID of "CCC" in which component tape 80 is not mounted on reel mounting section 74. In this instance, tape feeder information 143 in which feeder ID is "CCC" and component ID is "Z1111" is transmitted to tape feeder 70 in which feeder ID is "CCC". Tape feeder 70 stores tape feeder information 143 in memory section 142. Further, as indicated by information 201 in FIG. 6, splicing information 146 is set to "0". Next, it is assumed that component tape 80 having component ID "Z2222" is spliced and added to component tape 80 having component ID "Z1111". In this instance, tape feeder 70 having feeder ID of "CCC" is transmitted with information indicating that component tape 80 having a component ID of "Z2222" has been added. When the information is transmitted, tape feeder 70 updates splicing information 146 to "Z2222" as shown in information 202 of FIG. 6. Next, it is assumed that component tape 80 having the component ID "Z2222" is spliced and added to component tape 80 having the component ID "Z3333". In this instance, tape feeder 70 having the feeder ID of "CCC" is transmitted with information indicating that component tape 80 having the component ID of "Z3333" has been added. When the information is transmitted, tape feeder 70 updates splicing information 146 to "Z2222" "Z3333" as shown in information 203 of FIG. 6. Further, when component tape 80 is added, tape feeder 70 similarly adds and updates the component ID of the added component tape 80 to splicing information 146. As described above, splicing information 146 is information in which the component IDs are spliced, that is, information in which tape feeders 70 are arranged in the supplying order to mounting machine 32.

FIG. 5 shows an example of tape feeder database 125 stored in line management device 4 in the case of the above-described example. The number of rows in which the value of the item "feeder ID" of tape feeder database 125 is "CCC" is 3, which is the same as the number of component tapes 80 mounted on tape feeder 70 having the feeder ID "CCC". The value of the "component ID" in each of the three rows is "Z1111" "Z2222" "Z3333", and the values of the items of the "supplying order" are "1", "2", and "3", respectively. In this manner, for the same feeder ID, the component ID whose value of the "supplying order" of tape feeder database 125 is "1" matches the component ID of tape feeder information 143 stored in tape feeder 70. In addition, for the same feeder ID, the component ID whose value of the "supplying order" in tape feeder database 125 is "2" or later matches the component ID of splicing information 146 stored in tape feeder 70.

When component tape 80 of tape feeder 70 is depleted by the mounting work of mounting machine 16, control circuit 141 of tape feeder 70 transmits information indicating that component tape 80 has been depleted to mounting machine 16. When mounting machine 16 receives information indicating the depletion, mounting machine 16 transfers the information indicating the depletion to line management device 4. When line management device 4 receives information indicating the depletion, the row of feeder ID corresponding to the depleted feeder in tape feeder database 125, that is, the row in which the "supplying order" is "1", is deleted, and the values of the "supplying order" of the row with the "supplying order" of "2" or later are decremented to update tape feeder database 125. When splicing information 146 is stored in memory section 142, control circuit 141 of tape feeder 70 updates tape feeder information 143 by using component ID stored as splicing information 146 as component ID 145 of tape feeder information 143, and deletes first component ID of splicing information 146. On the other hand, when splicing information 146 is not stored in memory section 142, control circuit 141 of tape feeder 70 deletes component ID 145 of tape feeder information 143.

In addition, even when component tape 80 is spliced and added by the user in a state where tape feeder 70 is mounted in slot 108 of mounting machine 32, tape feeder information 143 and splicing information 146 stored in memory section 142 are updated. Similar to the preparation work, when the user splices and adds component tape 80 to tape feeder 70, the user assigns a number to slot 108, which will be described later, and causes bar codes 61, 62 to be read by a bar code reader (not shown). The bar code reader transmits the number of the specified slot 108 and the read feeder ID and component ID to mounting machine 32. When mounting machine 32 receives the number of the specified slot 108 and the read feeder ID and component ID, mounting machine 32 transmits the component ID to tape feeder 70 mounted in the number of the specified slot 108. Control circuit 141 of tape feeder 70 stores the transmitted information of the component ID in memory section 142 as splicing information 146. In addition, mounting machine 32 transmits to line management device 4 information in which the component ID is linked to the transmitted feeder ID. When line management device 4 receives the information in which the component ID is linked with the feeder ID, line management device 4 updates tape feeder database 125 in the same manner as in the case in which additional information is transmitted.

Figure 7:
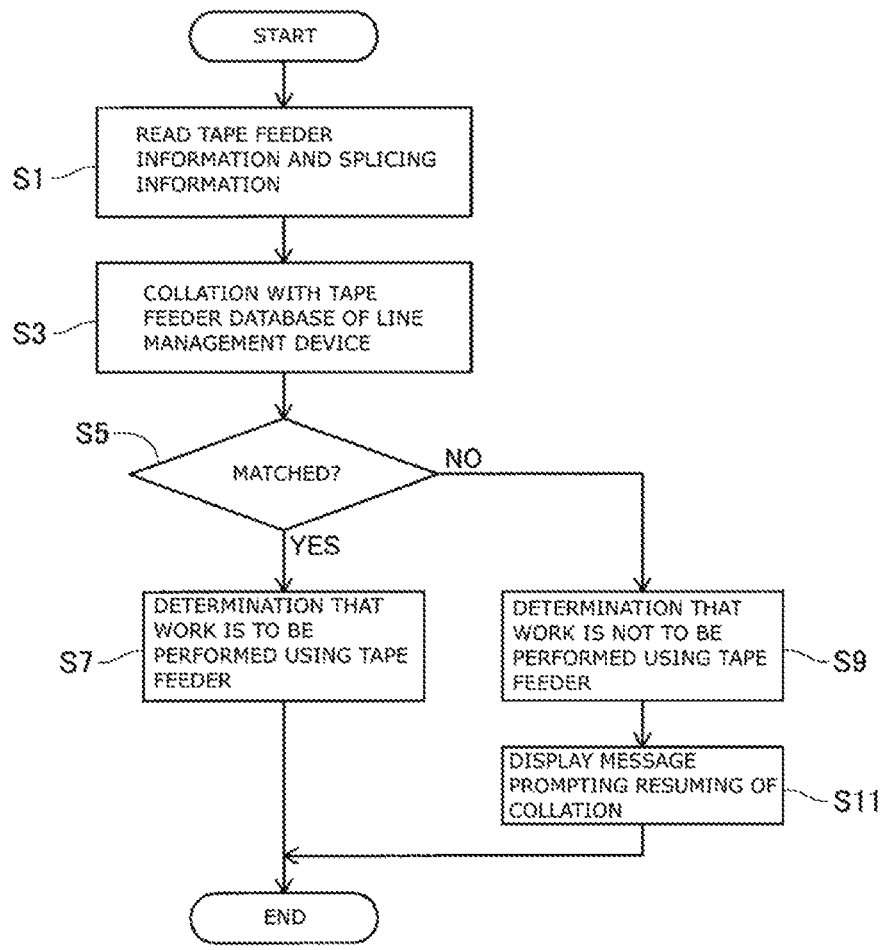
FIG. 7 A flowchart describing a matching process.

Next, the collation process executed by CPU 131 of mounting machine 32 will be described with reference to FIG. 7. The CPU included in mounting machine 36 also executes the collation process. The multiple slots 108 included in tape feeder holding stand 100 are assigned numbers in advance in order to enable identification of positions. The collation data includes information indicating in which slot 108, among the multiple slots 108, tape feeder 70 holding component tape 80 should be placed.

When CPU 131 determines that tape feeder 70 is mounted in slot 108 based on the detector output signals, the collation process is initiated. First, in step S1, CPU 131 causes second interface 135 to read tape feeder information 143 and splicing information 146 stored in memory section 142 of tape feeder 70. When CPU 131 reads out tape feeder information 143 and splicing information 146 via second interface 135, CPU 131 transmits signals to line management device 4 requesting collation of tape feeder information 143 and splicing information 146 (S3). When CPU 121 of line management device 4 receives the signal requesting collation, line management device 4 determines whether the received tape feeder information 143 and splicing information 146 match with stored tape feeder database 125.

More specifically, CPU 121 extracts a row that matches the values of the received feeder ID in tape feeder database 125. Next, CPU 121 determines whether the component ID of "1" in the "supply order" among extracted rows matches the component ID of the received tape feeder information 143. When CPU 121 determines that the component ID whose "supplying order" is "1" matches the component ID of the received tape feeder information 143, CPU 121 then determines whether each of the component IDs whose "supplying order" is "2" and later matches each of the component IDs of the received splicing information 146. If it is determined that each of the component IDs having a "supplying order" of "2" or later matches each of the component IDs of the received splicing information 146, CPU 121 determines that the received splicing information matches tape feeder database 125. On the other hand, in the case that CPU 121 determines that the component ID having the "supplying order" of "1" does not match the component ID of the received tape feeder information 143 and determines that the component ID having the "supplying order" of "2" or later does not match the component ID of the received splicing information 146, CPU 121 determines that the component ID does not match tape feeder database 125. When the feeder ID of the received tape feeder information 143 is not recorded in tape feeder database 125, CPU 121 determines that the ID does not match with tape feeder database 125.

Here, when it is determined that CPU 121 does not match, the following cases are assumed. One is a case where component tape 80 is mounted in empty tape feeder 70 on which component tape 80 is not mounted, for example, in production line 3, which is different from production line 2 in which the collation process is executed, and is a case in which tape feeder information 143 and splicing information 146 stored in memory section 142 are stored. Further, for example, tape feeder 70 used in production line 2 is moved to production line 3 by the user, and a new component tape 80 is spliced in production line 3. As described above, when an inconsistency is determined in step S5, it is considered that component tape 80 actually mounted on tape feeder 70 does not match the information of tape feeder database 125 stored in line management device 4.

CPU 121 of line management device 4 transmits a signal indicating "match" when it is determined that mounting machine 16 which requested collation is consistent, and CPU 121 transmits a signal indicating "non-match" when it is determined that mounting machine 16 is inconsistent. After executing step S3, CPU 131 determines whether tape feeder information 143 and splicing information 146 transmitted to line management device 4 match tape feeder database 125 stored in line management device 4 (S5). When a signal indicating a consistency is transmitted from line management device 4, CPU 131 determines that a match occurs (S5: YES), and when a signal indicating an inconsistency is transmitted from the line management device 4, CPU 131 determines that a match does not occur (S5: NO).

If it is determined that the electronic components are matched (S5: YES), CPU 131 determines that the mounting of electronic components supplied from mounted tape feeder 70 is to be performed (S7) and ends the collation process. On the other hand, if it is determined that the electronic components are not matched (S5: NO), CPU 131 determines that mounting of electronic components supplied from mounted tape feeder 70 is not to be performed and stops the mounting of supplied electronic components (S9). Next, a message prompting collation, such as "Please re-register the tape feeder" is displayed on operation device 29 (S11), for example, and the collation process is terminated. By displaying the resume-collation message, the user becomes aware that tape feeder database 125 stored in line management device 4 and component tape 80 actually mounted on tape feeder 70 are different from each other. Here, collation and registration constitute a series of operations in which tape feeder database 125 is updated by, for example, causing bar code reader 152 to read bar codes 61, 62, same as when preparation work is performed during the preparation period described above.

After performing S7, CPU 131 transmits to line management device 4 signals requesting line management device 4 to collate the number of slot 108 and the feeder ID with the collation data. Line management device 4 extracts the value of the component ID that matches the feeder ID transmitted from tape feeder database 125, and determines whether the value of the extracted component ID and the number of slot 108 match with the collation data. As a result, it is determined whether component tape 80 of tape feeder 70 attached to mounting machine 36 of the transmitting source is mounted in slot 108 having the same number as the collation data, whether component tape 80 can be used in mounting machine 36, and the like. If it is determined that line management device 4 is consistent, line management device 4 sends a signal indicating usability to mounting machine 32. Upon receiving a signal indicating the availability from line management device 4, mounting machine 32 performs mounting work of an electronic component supplied from tape feeder 70. Line management device 4 transmits the value of the component ID extracted from tape feeder database 125 at the same time as transmitting the signal indicating availability. Mounting machine 32 stores the transmitted component ID values in RAM 132 in association with the corresponding feeder IDs.

In step S7 of the matching process, when component tape 80 mounted on tape feeder 70 matches with tape feeder database 125, matching with the matching data is performed. As described above, since component tape 80 actually mounted on tape feeder 70 is compared with the matching data, erroneous mounting, for example, which may occur when comparing with tape feeder database 125 without having the latest tape feeder information, is suppressed. As described above, tape feeder database 125 is information used for creating traceability information. By using tape feeder database 125 used for creating traceability information, it is possible to perform a matching process for determining whether tape feeder database 125 matches component tape 80 actually mounted on tape feeder 70.

Here, production system 1 is an example of a production system, the mounting machines 32, 36 are examples of electronic component mounting machines, production lines 2, 3 are examples of multiple production lines, line management devices 4, 5 are examples of line management devices, component tape 80 is an example of a component tape, and tape feeder 70 is an example of a tape feeder. Reel mounting section 74 is an example of a mounting section, and communication device 151 is an example of a communication device. Step S1 is an example of a reading process, steps S3, S5 are examples of a receiving process, and step S9 is an example of a stopping process. The feeder ID is an example of a tape feeder ID. The component ID in which the supplying order of tape feeder database 125 is 2 or later is an example of first additional information. The information of the added component ID transmitted from communication device 151 to communication interface 147 is an example of second additional information. Operation device 29 is an example of a notification section.

According to the embodiment described above, the following effects are obtained. When component tape 80 is mounted on tape feeder 70, to which component tape 80 is not yet mounted on reel mounting section 74 of tape feeder 70, communication device 151 acquires from bar code reader 152, the feeder ID, being provided to tape feeder 70, and the component ID, being provided to component tape 80, and transmits tape feeder information 143, in which the acquired component ID is linked to the acquired feeder ID, to line management device 4 of production line 2, to which the component tape is to be mounted, as well as to tape feeder 70. When tape feeder information 143 is transmitted from communication device 151, line management device 4 adds tape feeder information 143 to tape feeder database 125 and stores tape feeder information 143. When tape feeder information 143 is transmitted from communication device 151, tape feeder 70 stores tape feeder information 143 in memory section 142.

When tape feeder 70 is mounted, CPU 131 of mounting machine 32 reads out tape feeder data 143 from tape feeder 70 in step S1. In step S3, tape feeder information 143 read out in step S1 and an inquiry, as to whether tape feeder information 143 matches tape feeder database 125 stored in line management device 4, are transmitted to line management device 4 of its own production line 2, and the result of the inquiry is received. In step S5, the result of mismatching is received, and when it is determined that mismatching has occurred, mounting work of electronic components supplied from tape feeder 70 is stopped in step S9.

A case, in which tape feeder information 143 stored in tape feeder 70 and tape feeder database 125 do not match, may be a case where tape feeder 70, in which component tape 80 is mounted in another production line, is mounted on mounting machine 32. In such a case, since the collation with the collation data is likely to be performed in tape feeder database 125 without having the latest tape feeder information stored in line management device 4, erroneous mounting can be suppressed by stopping the mounting of the electronic component supplied from tape feeder 70.

When component tape 80 is added by splicing to tape feeder 70 to which component tape 80 has already been mounted on reel mounting section 74, communication device 151 acquires from bar code reader 152 the feeder ID of tape feeder 70 and the component ID of the added component tape 80, and transmits additional information, in which the acquired feeder ID is linked to the acquired component ID, to line management device 4 of production line 2 to which component tape 80 is to be mounted. In addition, information of the added component ID, which is information indicating that component tape 80 has been added, is transmitted to tape feeder 70. When the additional information is transmitted from communication device 151, line management device 4 adds and stores the additional information in tape feeder database 125. When the information of the added component ID is transmitted from communication device 151, tape feeder 70 updates splicing information 146 based on the information of the added component ID. Therefore, tape feeder database 125 stored in line management device 4 matches the information stored in memory section 142 of tape feeder 70 in which splicing information 146 has been updated by communication device 151 of the same production line. In other words, when tape feeder 70 whose splicing information 146 has been updated in another production line is mounted on mounting machine 32, tape feeder database 125 of line management device 4 of the mounted production line does not match splicing information 146 stored in the mounted tape feeder 70. Therefore, the case where component tapes 80 are not aligned is, for example, a case where tape feeder 70 to which component tapes 80 are added in another production line is mounted on mounting machine 32. In such a case, since the collation with the collation data is likely to be performed in tape feeder database 125 without having the latest tape feeder information stored in line management device 4, erroneous mounting can be suppressed by stopping the mounting of the electronic component supplied from tape feeder 70.

When the information of the added component ID is transmitted, tape feeder 70 stores the transmitted component ID as splicing information 146. The component ID of added component tape 80 can be used as splicing information.

In step S11, CPU 131 displays a message on operation device 29 to prompt resuming of collation. Thus, the user can recognize that tape feeder database 125 needs to be updated.

Figure 8:
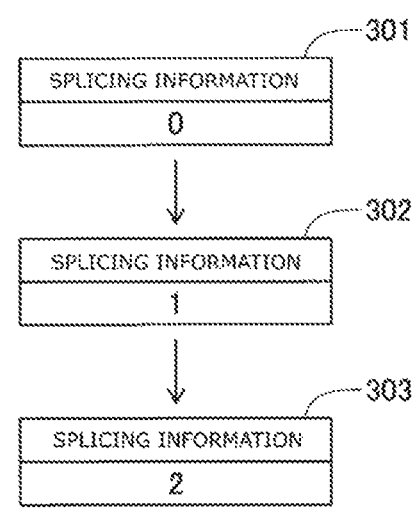
FIG. 8 A diagram describing splicing information according to another example.

Next, another example of splicing information 146 will be described with reference to FIG. 8. In the above description, the case where splicing information 146 is configured by the component ID has been described, but splicing information 146 may be configured by the number of times of splicing.

Specifically, for example, it is assumed that component tape 80 having the component ID of "Z1111" is mounted on tape feeder 70 having the feeder ID of "CCC" in which component tape 80 is not mounted on reel mounting section 74. In this case, similarly to the above, splicing information 146 is set to "0" as shown by information 301 in FIG. 8. Next, it is assumed that component tape 80 having component ID "Z2222" is spliced and added to component tape 80 having component ID "Z1111". In this case, tape feeder 70 updates splicing information 146 to "1" as indicated by information 302 in FIG. 8. Next, it is assumed that component tape 80 having the component ID "Z2222" is spliced and added to component tape 80 having the component ID "Z3333". In this case, tape feeder 70 updates splicing information 146 to "2" as indicated by information 303 in FIG. 8. As described above, since the value of splicing information 146 is incremented each time component tape 80 is added, splicing information 146 is a number indicating the number of times of splicing.

In this configuration, when the user splices and adds component tape 80 to tape feeder 70, communication device 151 transmits information to tape feeder 70 indicating that component tape 80 has been added (an example of second additional information) to communication interface 147. When tape feeder 70 receives the information indicating that component tape 80 has been added, tape feeder 70 increments the value of splicing information 146. When component tape 80 is spliced and added by the user while tape feeder 70 is mounted in slot 108 of mounting machine 32, the bar code reader transmits the number of the specified slot 108 and the read feeder ID and component ID to mounting machine 32 as in the above embodiment. When mounting machine 32 receives the number of the specified slot 108 and the read feeder ID and component ID, it transmits information indicating that component tape 80 has been added to tape feeder 70 mounted in the number of the specified slot 108. When control circuit 141 of tape feeder 70 receives information indicating that component tape 80 has been added, control circuit 141 increments the value of splicing information 146.

When component tape 80 of tape feeder 70 is depleted by the mounting work of mounting machine 16, control circuit 141 of tape feeder 70 transmits information indicating that component tape 80 has been depleted to mounting machine 16. When mounting machine 16 receives information indicating the depletion, if a component ID whose supply order is "2" is stored, mounting machine 16 transmits the stored component ID whose supply order is "2" to tape feeder 70. As described above, since mounting machine 32 stores the value of the component ID transmitted together with the signal indicating usability transmitted from line management device 4 at the time of matching with the matching data, mounting machine 32 transmits the component ID in which the stored supply order is "2". When the component ID is transmitted from mounting machine 32, control circuit 141 of tape feeder 70 updates tape feeder information 143 by using the transmitted component ID as component ID 145 of tape feeder information 143. When the value of splicing information 146 is 1 or more, control circuit 141 of tape feeder 70 decrements the value of splicing information 146 and updates splicing information 146.

The component ID is information for specifying, for example, a manufacturer, a component type, and the like, and is composed of multiple numbers, letters, and the like, and therefore, the amount of information is more than "the number of times of splicing" which is a one-digit number. Therefore, with the configuration of another example of the splicing information described above, since the amount of information stored in memory section 142 is smaller than the component ID, the capacity of memory section 142 and the processing time for memory section 142 to store the information can be reduced.

It is needless to say that the present disclosure is not limited to the above-described embodiments, and various modifications and changes can be made within a scope not departing from the spirit of the present disclosure. For example, in the above description, it has been described that centralized management apparatus 6 transmits various data of a predetermined period to line management device 4. In addition, for example, when line management device 4 updates tape feeder database 125, production system 1 may transmit the update information to centralized management apparatus 6 each time, and centralized management apparatus 6 may transmit the update information to another line management device. Alternatively, for example, line management device 4 may periodically transmit the update information. In the case of such a configuration, for example, when a communication failure has not occurred in wide area network WAN, the latest tape feeder database shared by multiple line management devices is stored. For example, even in a state where a communication failure occurs in wide area network WAN and the line management device is not updated to the latest tape feeder database, erroneous mounting can be suppressed by executing the matching process. Alternatively, when it is determined in step S5 of the matching process that there is no match, the line management device may request centralized management apparatus 6 to transmit the update information. In this configuration, when the request for transmission of update information is received, centralized management apparatus 6 may transmit a signal instructing transmission of update information to multiple line management devices.

For example, in the above description, production system 1 has been described in which each of the production lines such as production line 2 includes a work table such as work table 51, but the present disclosure is not limited thereto. For example, one work table may be provided for multiple production lines. In this case, which of the multiple production lines tape feeder 70 will be mounted on, that is, which production line is scheduled to perform mounting, may be inputted by a user, for example.

Further, in the above description, tape feeder information 143 and splicing information 146 have been described separately in the case where component tape 80 is mounted on the empty tape feeder 70 to which component tape 80 is not mounted and in the case where component tape 80 is added to tape feeder 70 to which component tape 80 is already mounted. For example, when multiple component tapes 80 are mounted on tape feeder 70 at the same time, communication device 151 may acquire multiple component IDs from bar code reader 152 and transmit to line management device 4 a grouping of information in which the acquired feeder IDs are linked to acquired component IDs in the supplying order.

In the above description, operation device 29 is exemplified as the notification section, but the present disclosure is not limited thereto. For example, in the case where line management device 4 is configured to include a display, information for prompting matching may be displayed on the display of line management device 4.

In the above description, the matching with the matching data is performed after the execution of step S7 of the matching process, but the present disclosure is not limited thereto. For example, when line management device 4 determines that the received tape feeder information 143 and splicing information 146 match the stored tape feeder database 125 in step S3 of the matching process, line management device 4 may perform matching with the matching data based on tape feeder database 125.

In the above description, line management device 4 performs matching with the matching data, but the present disclosure is not limited to this, and mounting machine 32 may be configured to perform matching with the matching data. More specifically, mounting machine 32 may be configured to store collation data, transmit the component IDs based on tape feeder database 125 from line management device 4, and perform the collation between the transmitted component IDs and the collation data.

Although tape feeder 70 has been described as storing tape feeder information 143 in which component ID 145 is linked with feeder ID 144, tape feeder 70 may be configured to store each of the feeder ID and the component ID.

The configuration of tape feeder database 125 is not limited to the above. For example, instead of the supplying order, the arrangement of component IDs may be identified by, for example, the date and time when information, such as the tape feeder information, is transmitted from mounting machine 32. In addition, line management device 4 has been described as deleting the row whose "supplying order" for the corresponding feeder ID of tape feeder database 125 is "1" when it receives information indicating depletion, but alternatively depletion may be determined without deletion, for example, by relying on the date and time when information indicating depletion was received.

REFERENCE SIGNS LIST

1 Production system, 2,3 Production line, 4,5 Line management device, 29 Operation device, 32,36 Electronic component mounting machine, 51 Work table, 70 Tape feeder, 74 Reel mounting section, 80 Component tape

The invention claimed is:

1. A production system, comprising:
multiple production lines, each production line having at least one electronic component mounting machine;
a line management device provided in each of the multiple production lines;
a tape feeder having a mounting section configured to be mounted with a component tape in which electronic components are accommodated in a carrier tape; and
a communication device configured to acquire a tape feeder ID assigned to a tape feeder and a component ID assigned to a component tape when the component tape is mounted in a tape feeder whose mounting section is not mounted with a component tape, and transmit tape feeder information to the line management device of the production line in which mounting is to be performed and said tape feeder, the tape feeder information including acquired tape feeder IDs and component IDs which are linked with each other;

wherein each of the line management device and the tape feeder stores the tape feeder information when the tape feeder information from the communication device is transmitted; and wherein the electronic component mounting machine executes:
- a reading process in which the tape feeder information is read from the tape feeder when the tape feeder is mounted;
- a receiving process in which the tape feeder information read in the reading process and an inquiry, as to whether said tape feeder information and the tape feeder information stored in the line management device match, are transmitted to the line management device of the production line in which the tape feeder is mounted, and a result of said inquiry is received; and
- a stopping process which stops a mounting of the electronic component supplied by said tape feeder when a non-matching result is received, and wherein, when the component tape is spliced to the tape feeder having the component tape already mounted in the mounting section, and an added component tape is added, the communication device acquires the tape feeder ID of the tape feeder and the component ID of the added component tape, transmits first additional information, linking the acquired component ID with the acquired tape feeder ID, to the line management device of the production line to be mounted, and transmits second additional information indicating that the added component tape has been added.

2. The production system of claim 1,
wherein the line management device stores the first additional information when the first additional information is transmitted from the communication device;
wherein the tape feeder updates splicing information that can specify a number of component tapes stored therein in advance based on the second additional information when the second additional information is received from the communication device; and
wherein the electronic component mounting machine reads the splicing information from the tape feeder along with the tape feeder information during the reading process;
transmits, in addition to the inquiry for the tape feeder information, an inquiry, as to whether the splicing information matches the first additional information stored in the line management device, to the line management device of the production line in which the tape feeder is mounted;
receives the result of said inquiry, and executes the stopping process upon receiving a result that the splicing information is not consistent during the receiving process.

3. The production system of claim 2, wherein the splicing information is information in which the component IDs of the component tapes added by splicing are arranged in order of splicing.

4. The production system of claim 2, wherein the splicing information is a number of splices.

5. The production system of claim 1, the production system further comprises a notification section for sending out a notification for prompting an update of the tape feeder information stored in the line management device when the tape feeder information read in the reading process does not match the tape feeder information stored in the line management device.

6. A control method of a production system, the production system comprising:
multiple production lines, each production line having at least one electronic component mounting machine; a line management device provided in each of the multiple production lines; a tape feeder having a mounting section configured to be mounted with a component tape in which electronic components are accommodated in a carrier tape; and a communication device;

wherein the control method of the production system comprises:
a step in which the communication device acquires a tape feeder ID assigned to a tape feeder and a component ID assigned to a component tape when the component tape is mounted in a tape feeder whose mounting section is not mounted with a component tape, wherein the communication device transmits tape feeder information to the line management device of the production line, in which mounting is to be performed, and the tape feeder, the tape feeder information including acquired tape feeder IDs and component IDs which are linked with each other;

a storing step in which each of the line management device and the tape feeder stores the tape feeder information when the tape feeder information is transmitted from the communication device;

a reading step in which the electronic component mounting machine reads out the tape feeder information when the tape feeder is mounted in the electronic component mounting machine;

a receiving step in which the tape feeder information read out in the reading step, and an inquiry as to whether said tape feeder information and the tape feeder information stored in the line management device match, are transmitted to the line management device of the production line in which the tape feeder is mounted, and the result of said inquiry is received; and a stopping step in which the electronic component mounting machine stops a mounting of the electronic component supplied to the electronic component mounting machine by said tape feeder when a non-matching result is received in the receiving step.

* * * * *